Figure 1:
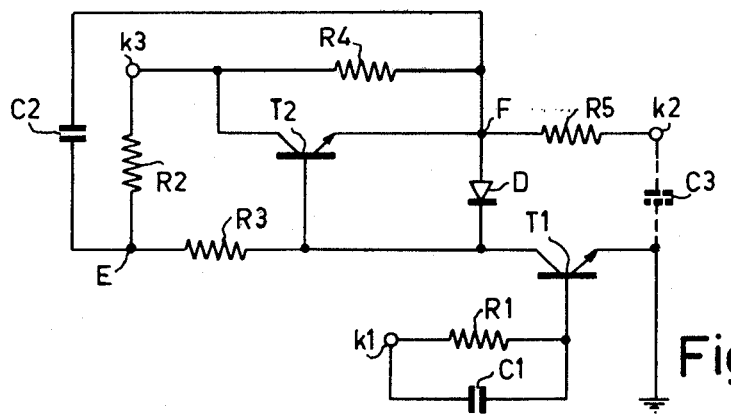

United States Patent [19]
Van Tol

[11] 3,968,385
[45] July 6, 1976

[54] SOLID-STATE STORAGE DRIVE

[75] Inventor: Willem Cornelis Van Tol, Eindhoven, Netherlands

[73] Assignee: U.S. Philips Corporation, New York, N.Y.

[22] Filed: Oct. 31, 1974

[21] Appl. No.: 519,619

[30] Foreign Application Priority Data
Nov. 7, 1973 Netherlands................ 7315229

[52] U.S. Cl.............................. 307/270; 307/246; 307/297; 307/293
[51] Int. Cl.²........................................ H03K 17/00
[58] Field of Search............ 307/293, 246, 270, 297

[56] References Cited
UNITED STATES PATENTS

| | | | |
|---|---|---|---|
| 3,143,659 | 9/1964 | Padalino............................ | 307/246 |
| 3,419,736 | 12/1968 | Walsh................................ | 307/246 |
| 3,531,660 | 9/1970 | Engberg............................ | 307/270 |
| 3,539,827 | 10/1970 | Crowe................................ | 307/246 |

*Primary Examiner*—Stanley D. Miller, Jr.
*Assistant Examiner*—B. P. Davis
*Attorney, Agent, or Firm*—Frank R. Trifari; Daniel R. McGlynn

[57] ABSTRACT

A drive unit, such as a drive unit for a storage device including an integrated solid-state store, including an input terminal, a capacitively loaded output terminal, and a charging transistor which is connected between a supply terminal and the output terminal. The output terminal is connected, by means of a rectifying member, to a discharge switch, the output terminal also being connected, by means of a capacitive member, to a voltage supply circuit which is connected between the supply terminal and a control electrode of the charging resistor.

4 Claims, 3 Drawing Figures

SOLID-STATE STORAGE DRIVE

The invention relates to a drive unit, notably a drive unit for a storage device including an integrated solid-state store, comprising an input terminal, a capacitively loaded output terminal, and a charging transistor connected between a supply terminal and the output terminal. A storage device of this kind may comprise one or more known stores. The driving thereof requires steep pulse edges in order to increase the operating speed. Furthermore, the voltage levels of the drive pulses, for example, the clock pulses, should satisfy severe requirements as regards tolerances. In order to satisfy the said requirements without using very powerful supply sources, the invention is characterized in that the output terminal is connected, via a rectifying member, to a discharge switch, the output terminal being connected, via a capacitive member, to a centre tapping of a voltage distribution circuit which is connected between the supply terminal and a control electrode of the charging transistor, with the result that, when the charging transistor is conductive, an additional control voltage can be applied to the control electrode. Part of the supply voltage is thus branched off by the voltage divider. This externally applied signal can be added to a voltage transition on the control electrode, so that a very high driving voltage is briefly present. The capacitive member does not influence the stationary condition. In that case it forms no load for the supply source.

The invention will be described in detail hereinafter with reference to a number of Figures.

Figure 2:
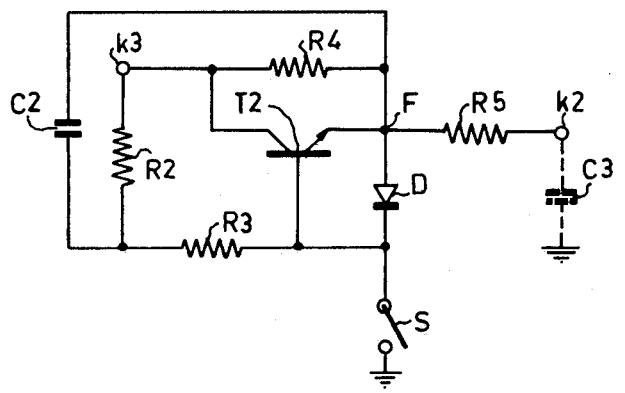
Figure 3:
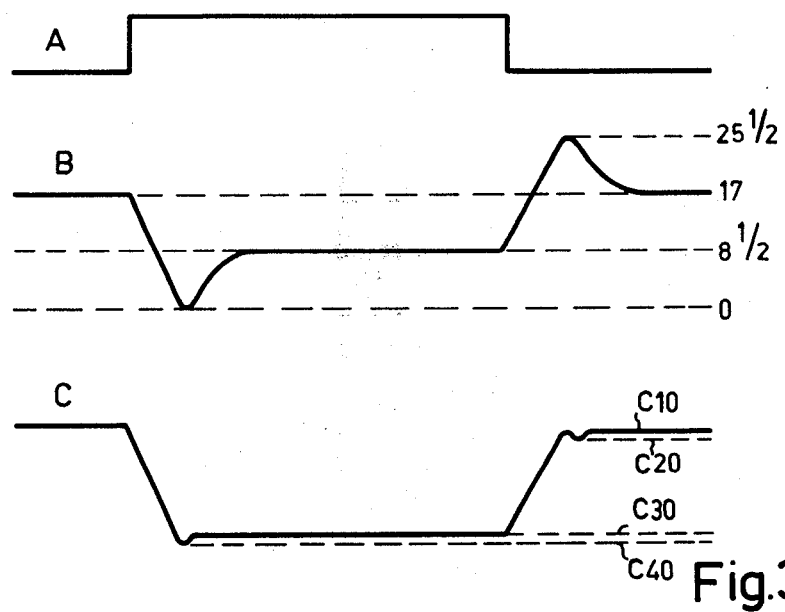

FIG. 1 shows a drive unit according to the invention.
FIG. 2 shows an equivalent diagram of FIG. 1.
FIG. 3 shows a number of wave forms. The general configuration of the storage device will not be elaborated herein.

FIG. 1 shows a drive unit according to the invention, comprising two transistors T1, 2, five resistors R1 ... 5, three capacitors C1 ... 3, and three connection terminals $k1$ ... 3. Terminal $k3$ is connected to a voltage source which is not shown and which supplies a voltage of, for example, 17 volts. Terminal $k1$ is a signal input terminal and is connected to a signal source not shown. Terminal $k2$ is a signal output terminal and is connected to a known solid-state store, for example, to the clock pulse input thereof. Capacitor C3 symbolizes the equivalent capacitance thereof for terminal $k2$. Terminal $k2$ is connected to the store via a line, for example, a track of vapour-deposited metal having an inductance L. The value of resistor R5 may be such that the oscillatory circuit formed by L and C3 is just critically damped: $R5 = 2\sqrt{L/C}$. The resistive loading by the connected store is assumed to be small.

FIG. 3 shows a number of wave forms in this respect. Curve A represents the signal on the signal input terminal $k1$. Terminal $k1$ is initially at a low potential. As a result, the base of transistor T1 is also at a low potential, so that this transistor is cut off. Consequently, the base of transistor T2 is at the same potential as the terminal $k2$, so at 17 volts, for example. Because transistor T1 is cut off and terminal $k2$ is not resistively loaded, transistor T2 is not conductive either. Point F is connected to terminal $k3$ via the resistor R4, with the result that point F also carries 17 volts. Curve B in FIG. 3 represents the potential at point E, and curve C that at point F.

If the potential of terminal $k1$ subsequently becomes high, the following takes place. The resistor R1 and the capacitor C1 form a differentiating network. As a result, the transistor T1 is quickly saturated. The capacitor C3 is discharged via the resistor R5, the diode D and the transistor T1. The equivalent diagram is shown in FIG. 2: the switch S is closed. Along with the discharging of the capacitor C3, the potential at the points E and F decreases. The potential of the base electrode of transistor T2 decreases, with the result that this transistor is cut off. Finally, the capacitor C2 is charged: this capacitor is connected to the centre tapping (point E) of the voltage divider formed by the resistors R2 and R3. In the present example the resistors R2 and R3 are identical, and the potential increases to 8.5 volts. Finally, the potential of point F slightly increases again because of a voltage drop across transistor T1, for example, by 0.9 volts. This effect may be absent for a given proportioning.

If the potential of the terminal $k1$ subsequently becomes low again, the following occurs. Via the capacitor C1, the base electrode of transistor T1 quickly assumes a low potential, with the result that transistor T1 is cut off. As a result, the base potential of the transistor becomes higher, with the result that the transistor T2 becomes conductive and the capacitor C3 is charged. The voltage drop between the points E and F is 8.5 volts, and this drop is sustained for some time. Consequently, any voltage increase at the point F is transmitted to the point E, and hence to the base electrode of the transistor T2. While the potential of point F increases to about 17 volts, the potential of point E increases to $17 + 8.5 = 25.5$ volts. As a result, the base electrode of transistor T2 is driven by a high control voltage, so that T2 is quickly saturated. Consequently, the capacitor C3 (equivalent capacitance) is quickly charged. This effect represents, therefore, differential positive feedback. After some time, the capacitor C2 is discharged again via the resistor R2, with the result that the potential of point E decreases from about 25.5 volts to 17 volts. The potential of point F also decreases, because a small voltage drop occurs across the transistor T2. This effect amounts to, for example, 0.3 volts. This is denoted in FIG. 3 by the level difference between the lines C10 and C20. Finally, the potential at point F increases again to the level of terminal $k3$, because the store does not constitute a resistive load.

The following circuit components were used in the present emnbodiment: R1: 1210 ohms; R2, 3: 825 ohms; R4: 1780 ohms; R5: depending on the load (L, C3); C1, 2: 150 pF. The transistors T1, 2 are of the type BSS40, and the diode D is of the type BAV10.

The circuit shown was given as one feasible embodiment according to the invention. Other embodiments are also feasible. The circuit may comprise transistors of the other conductivity type. The relationship between the resistors R2 and R3 may be different. The resistor R2 may be replaced by a diode. Point E is then always at least at 17 volts. Finally, the drive unit can be used for purposes other than a storage device. The fast charging and discharging of a capactive load by means of a device according to the invention is then also advantageous.

What is claimed is:
1. A drive unit comprising
   an input terminal;
   a capacitively loaded output terminal;

a charging transistor connected between said supply terminal and said output terminal, said output terminal being connected through a rectifying member to said input terminal;

a discharge circuit connected between said rectifying member and said input terminal, comprising a transistor having one electrode connected to said rectifying member, and another electrode connected to ground;

said input terminal being connected to the base of said transistor in said discharge circuit by means of a differentiating network comprising a resistor and a capacitor connected in parallel between said input terminal and said base of said transistor in said discharge circuit;

said output terminal being connected, through a capacitive member, to a center tapping of a voltage distribution circuit connected between said supply terminal and a control electrode of said charging transistor so that when said charging transistor is conductive, an additional control voltage is applied to said control electrode.

2. A drive unit as defined in claim 1, wherein said discharge circuit comprises a transistor having one electrode connected to said rectifying member, and another electrode connected to ground.

3. A drive unit as defined in claim 2, wherein said input terminal is connected to the base of said transistor in said discharge circuit by means of a differentiating network.

4. A drive unit as defined in claim 3, wherein said differentiating network comprises a resistor and a capacitor connected in parallel between said input terminal and said base of said transistor in said discharge circuit.

* * * * *